(12) United States Patent
Zhang et al.

(10) Patent No.: US 11,437,488 B2
(45) Date of Patent: Sep. 6, 2022

(54) SPLIT-GATE MOSFET WITH GATE SHIELD

(71) Applicant: Applied Materials, Inc., Santa Clara, CA (US)

(72) Inventors: Qintao Zhang, Mt Kisco, NY (US); Samphy Hong, Saratoga Springs, NY (US); David J. Lee, Poughkeepsie, NY (US); Jason Appell, Albany, NY (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/102,573

(22) Filed: Nov. 24, 2020

(65) Prior Publication Data
US 2022/0165863 A1 May 26, 2022

(51) Int. Cl.
| | | |
|---|---|---|
| *H01L 29/16* | (2006.01) |
| *H01L 29/66* | (2006.01) |
| *H01L 29/78* | (2006.01) |
| *H01L 29/06* | (2006.01) |
| *H01L 21/02* | (2006.01) |
| *H01L 21/203* | (2006.01) |
| *H01L 21/8234* | (2006.01) |
| *H01L 29/423* | (2006.01) |

(52) U.S. Cl.
CPC ........ *H01L 29/6653* (2013.01); *H01L 21/203* (2013.01); *H01L 21/823493* (2013.01); *H01L 29/4236* (2013.01); *H01L 29/6656* (2013.01)

(58) Field of Classification Search
CPC .......... H01L 21/203; H01L 21/823493; H01L 21/823892; H01L 29/407; H01L 29/42356; H01L 29/4236; H01L 29/6653; H01L 29/6656; H01L 29/66704; H01L 29/66734; H01L 29/7813; H01L 29/7825
See application file for complete search history.

(56) References Cited

U.S. PATENT DOCUMENTS

| | | | | |
|---|---|---|---|---|
| 2018/0212027 A1* | 7/2018 | Cai | .................. | H01L 29/66734 |
| 2018/0277637 A1* | 9/2018 | Meiser | .............. | H01L 29/66068 |
| 2019/0348510 A1* | 11/2019 | Yilmaz | .............. | H01L 29/66734 |

* cited by examiner

*Primary Examiner* — David C Spalla
(74) *Attorney, Agent, or Firm* — KDB Firm PLLC (57) ABSTRACT

Disclosed herein are methods for forming split-gate MOSFETs including a gate shield. In some embodiments, a method may include providing a device structure including a well formed in an epitaxial layer, forming a set of trenches through the well and the epitaxial layer, implanting the device structure to form a gate shield layer at a bottom of each of the set of trenches, and forming a gate spacer layer over the device structure including within the set of trenches.

16 Claims, 5 Drawing Sheets

SPLIT-GATE MOSFET WITH GATE SHIELD

FIELD OF THE DISCLOSURE

The present embodiments relate to semiconductor device patterning, and more particularly, to split-gate MOSFETs with a gate shield.

BACKGROUND OF THE DISCLOSURE

Split-gate MOSFETs, which may also be referred to as shielded-gate MOSFETs, divide gate structures into two electric potentials using one or more isolation layers. The area of the gate located above the isolation layer(s) corresponds to a channel of the MOSFET, while the area of the gate located below the isolation layer(s) is electrically coupled to a source potential via a metal interconnect for the generation of two-dimensional charge balance under blocking operation. As a result, excessive gate-to-drain capacitance in a traditional trench MOSFET is reduced via the isolation layers, which has the effect of reducing switching loss.

However, as higher-voltage applications become the norm, and the cell pitch of the MOSFET increases, cell resistance also increases. Accordingly, improved split-gate MOSFET approaches are needed to maximize scalability.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include providing a device structure including well formed in an epitaxial layer, forming a set of trenches through the well and the epitaxial layer, implanting the device structure to form a gate shield layer at a bottom of each of the set of trenches, and forming a gate spacer layer over the device structure including within the set of trenches.

In another aspect, a method of forming a MOSFET device may include providing a device structure including an epitaxial layer atop a substrate, wherein a well is formed in the epitaxial layer, forming a set of trenches through the well and the epitaxial layer, and implanting the device structure to form a gate shield layer at a bottom of each of the set of trenches. The method may further include forming a first gate material and a second gate material over the gate shield layer at the bottom of each of the set of trenches, wherein the first gate material and the second gate material are separated by a gate isolation layer.

In yet another aspect, a semiconductor device may include a device structure including a well formed in an epitaxial layer, and a gate formed in each of a set of trenches, wherein the set of trenches is formed through the well and the epitaxial layer, and wherein the gate includes a first gate material separated from a second gate material by a gate isolation layer. The semiconductor device may further include a gate shield layer in the epitaxial layer, beneath the gate of each of the set of trenches, wherein the gate shield layer is grounded through the first gate material.

BRIEF DESCRIPTION OF THE DRAWINGS

The accompanying drawings illustrate exemplary approaches of the disclosure, including the practical application of the principles thereof, as follows.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where various embodiments are shown. The methods and devices may be embodied in many different forms and are not to be construed as being limited to the embodiments set forth herein. Instead, these embodiments are provided so the disclosure will be thorough and complete, and will fully convey the scope of the methods to those skilled in the art.

Embodiments described herein advantageously provide a grounded under-trench gate shielding layer to maximize scalability of MOSFET devices. One process may include opening trenches in a device structure having a well formed in an epitaxially layer, and performing an ion implant to the bottom of the trenches using, for example, aluminum ions, to form a gate shielding layer in the epitaxial layer. A gate may be formed in the trenches by depositing multiple gate layers. In some embodiments, a first gate material is separated from a second gate material by an isolation layer, which may be an oxidation layer formed over an exposed surface of the first gate material. Although non-limiting, the first gate material and the second gate material may be different materials, wherein the first gate material may be a p-type polysilicon, and the second gate material may be an active n-type poly silicon.

Figure 1:
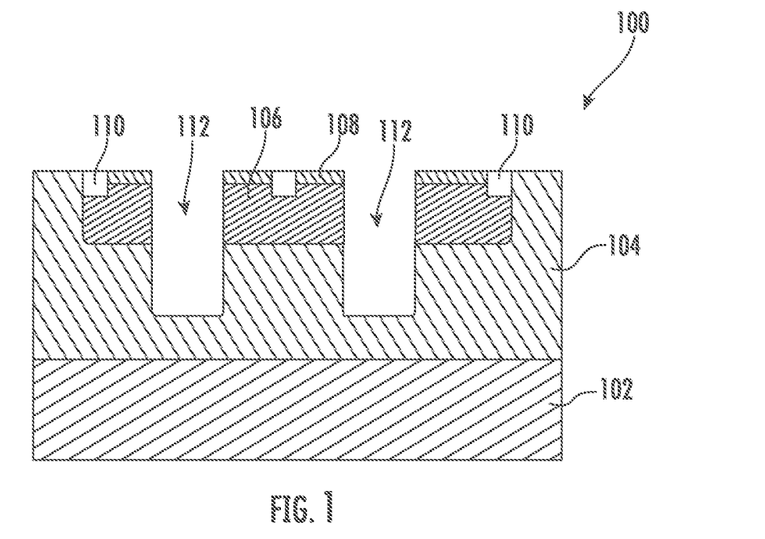
FIG. 1 is a cross-sectional side view of a device structure with a set of trenches formed therein, according to embodiments of the present disclosure.

FIG. 1 is a side cross-sectional view of a semiconductor device structure (hereinafter "device") 100, such as a split-gate MOSFET, according to one or more embodiments described herein. The device 100 may correspond to a cell region having a substrate 102, an epitaxial layer 104, a well 106, a source region or layer 108, and a plurality of body contacts 110. Although non-limiting, the epitaxial layer 104 may be a silicon carbide (SiC) n-type drift layer, the well 106 may be a p-type well, the source layer 108 may be an N⁺ source layer, and the plurality of body contacts 110 may be P⁺ body contacts. Shown as a single layer, the epitaxial layer 104 may include multiple layers in other embodiments. As known, the well 106 may be formed using a plurality of doping steps or epitaxy steps.

As further shown, a set of trenches 112 may be formed through the epitaxial layer 104, the well 106, and the source layer 108. As will be described herein, a split-gate may be formed within each of the set of trenches 112, wherein one or more of the gates is grounded (GND). Although non-limiting, the set of trenches 112 may be formed by one or more blocking and vertical etch processes. As demonstrated, the set of trenches 112 may be formed after the well 106 and source layer 108 are formed.

Figure 2:
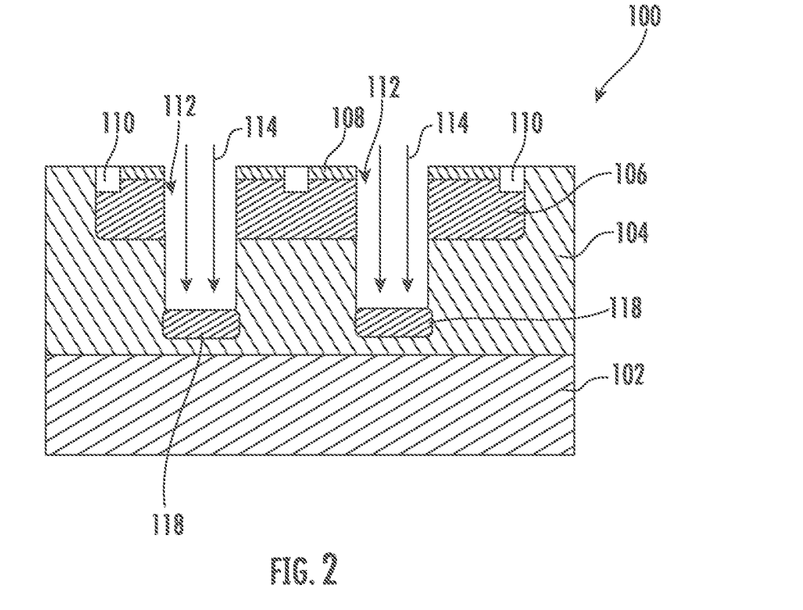
FIG. 2 is a side cross-sectional view illustrating an ion implantation to the device structure, according to embodiments of the present disclosure.

FIG. 2 demonstrates an ion implant 114 performed to the device 100. More specifically, p-type ions (e.g., aluminum) may be implanted vertically, or with minor tilt, into a bottom of the set of trenches 112 at a desired dose/energy to form a gate shield layer 118 in/on the epitaxial layer 104. Other p-type ions of the ion implant 114 may include boron, gallium, and/or indium at room temperature or high temperature. In some embodiments, the ion implant 114 may reduce the concentration of a portion of the epitaxial layer 104. Therefore, the doping concentration of the gate shield layer 118 may be less than the doping concentration of the epitaxial layer 104.

Figure 3:
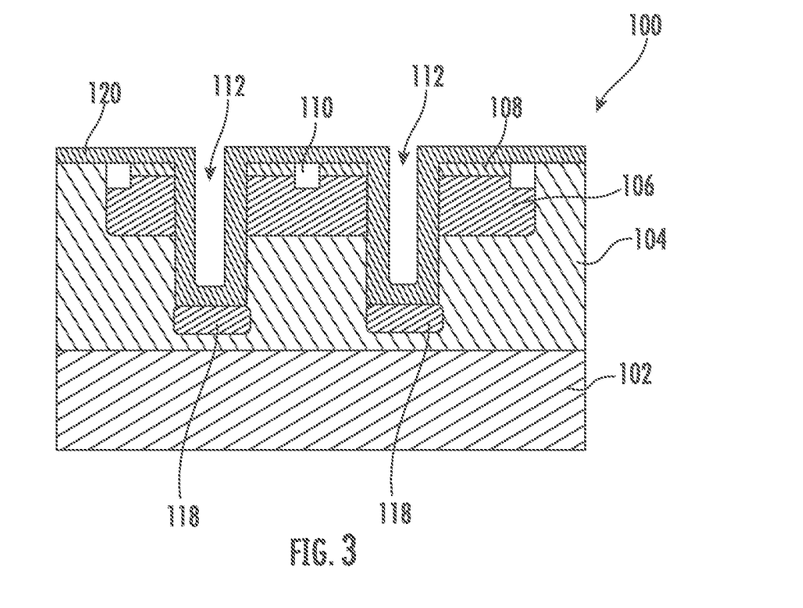
FIG. 3 is a side cross-sectional view illustrating a spacer layer formed over the device structure, according to embodiments of the present disclosure.

FIG. 3 demonstrates formation of a spacer layer 120 over the device 100. In some embodiments, the spacer layer 120 may be a uniform oxide layer or other dielectric layer(s) formed using a conformal hot thermal oxide process or a dielectric deposition process, such as CVD, PVD. As shown, the spacer layer 120 is formed over the source layer 108 and within the set of trenches 112. More specifically, the spacer layer 120 may be formed over or atop the gate shield layer 118 in each of the trenches 112.

Figure 4:
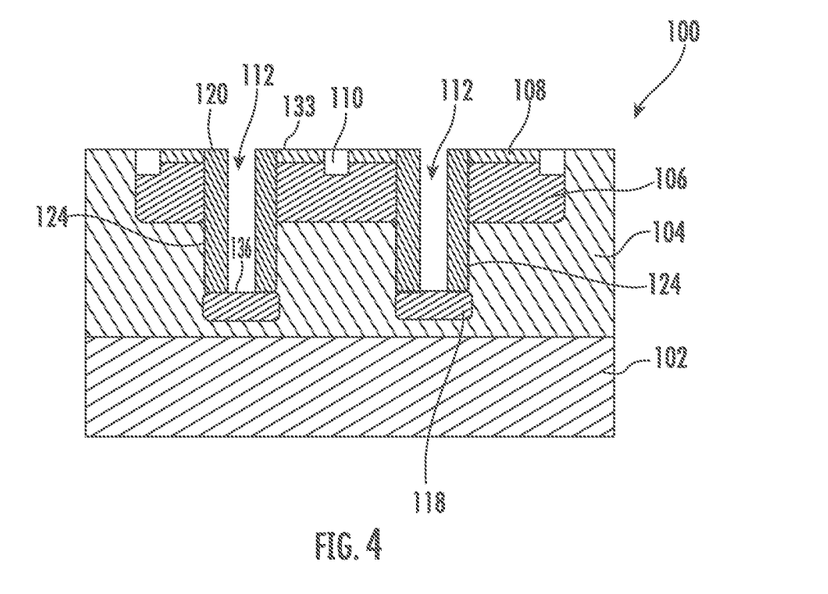
FIG. 4 is a side cross-sectional view illustrating partial removal of the spacer layer, according to embodiments of the present disclosure.

The spacer layer 120 may then be partially removed, as shown in FIG. 4. In some embodiments, the spacer layer 120 is removed using a dry etch process to remove the spacer layer 120 from a top surface 133 of the source layer 108 and from an upper surface 136 the gate shield layer 118 at the bottom of each trench 112. As shown, the spacer layer 120 remains along each sidewall 124 of the trenches 112. In some embodiments, the spacer layer 120 may not fully cover the entire height of the sidewall 124. Instead, an upper part of the spacer layer 120 may be removed due to the etch process.

Figure 5:
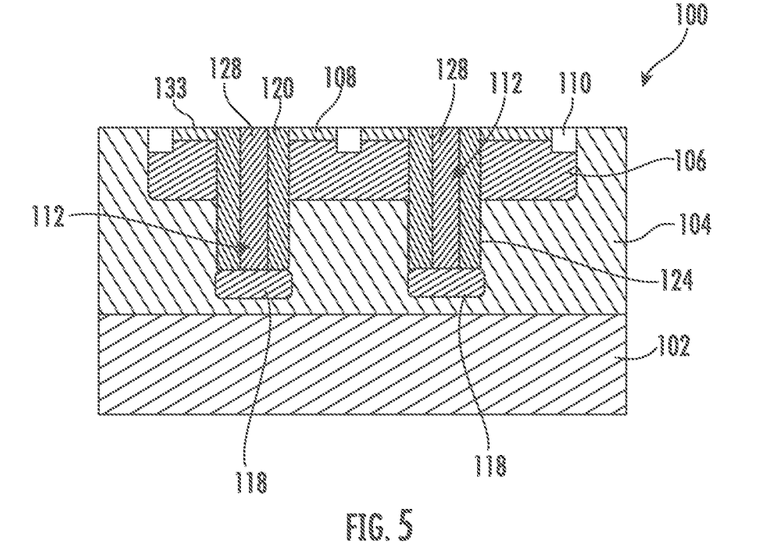
FIG. 5 is a side cross-sectional view illustrating formation of a first gate material, according to embodiments of the present disclosure.

As shown in FIG. 5, a first gate material 128 may then be formed in the trenches 112. In some embodiments, the first gate material 128 is a p-type polysilicon, which is heavily doped, to connect with the gate shield layer 118. As shown, the first gate material 128 is formed between the spacer layer 120 in the trenches 112, and is generally planar with the source layer 108. In some embodiments, the first gate material 128 may be deposited and then planarized (e.g., via CMP) or etched back selective to the top surface 133 of the source layer 108.

Figure 6:
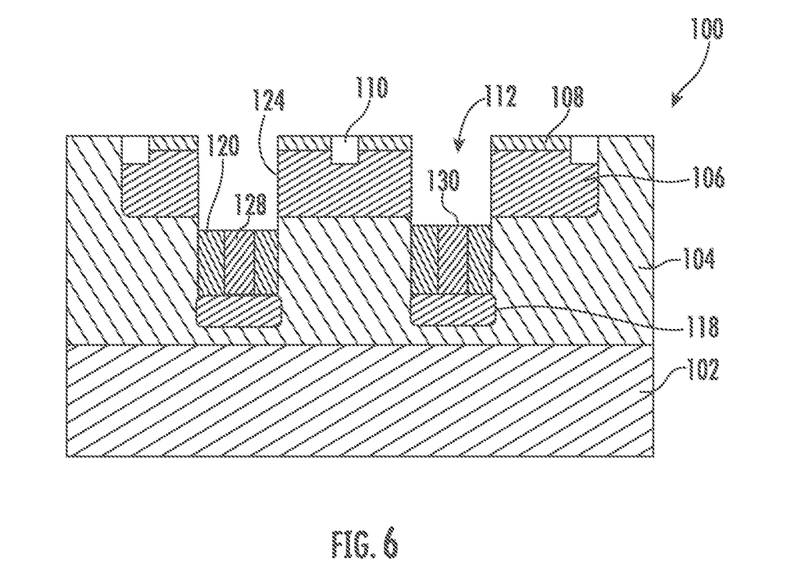
FIG. 6 is a side cross-sectional view illustrating partial recessing of the first gate material and the spacer layer, according to embodiments of the present disclosure.

The first gate material 128 and the spacer layer 120 may then be partially recessed, as shown in FIG. 6. In some embodiments, an etch process may be performed to remove the first gate material 128 and the spacer layer 120. A top surface 130 of the first gate material 128 may be positioned below the well 106, although embodiments herein are not limited in this context. As shown, the etch process is selective to the sidewalls 124 of the trenches 112.

Figure 7:
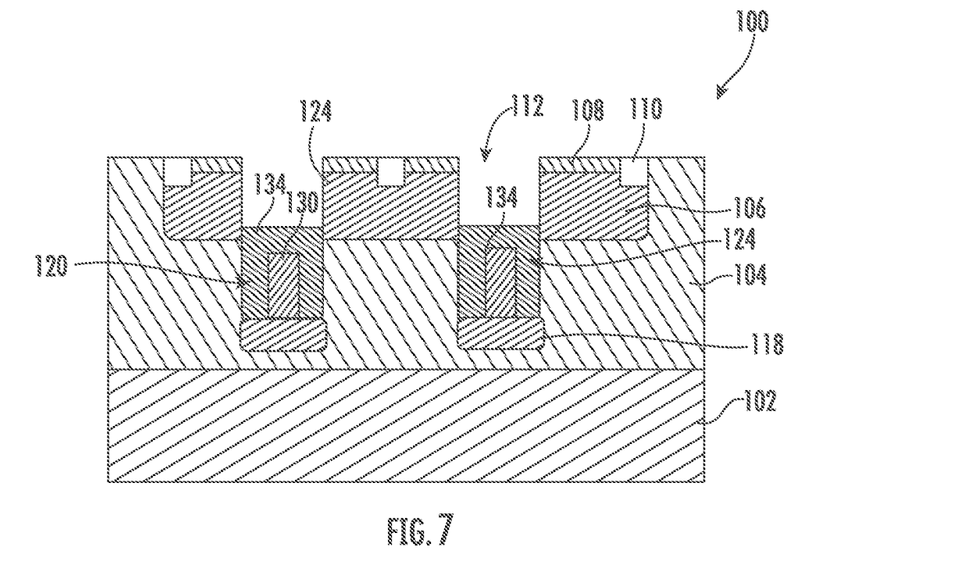
FIG. 7 is a side cross-sectional view illustrating formation of an isolation layer, according to embodiments of the present disclosure.

As shown in FIG. 7, the first gate material 128 may then be oxidized to form a gate isolation layer 134 along the top surface 130 thereof. The gate isolation layer 134 may be a layer of oxide, which extends to the oxide of the spacer layer 120 along the sidewalls 124 of the trenches 112.

Figure 8:
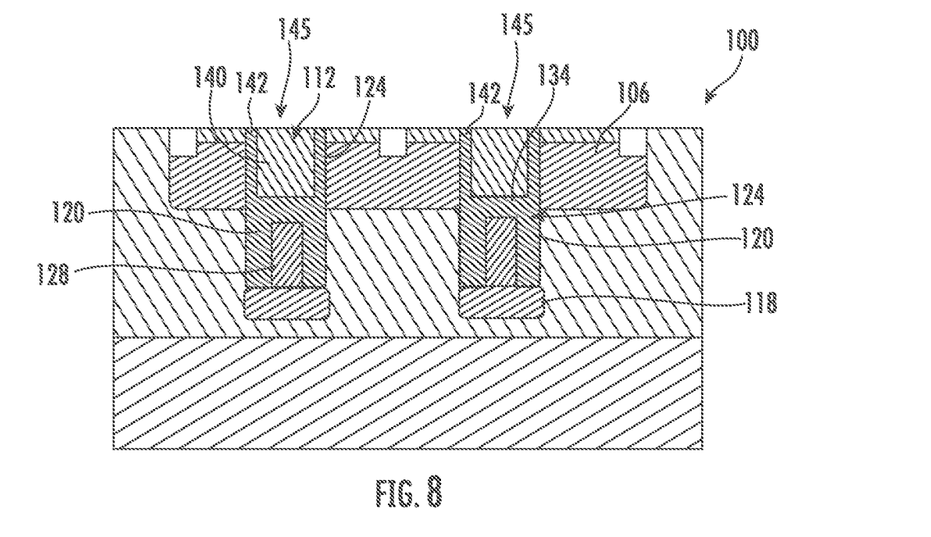
FIG. 8 is a side cross-sectional view illustrating formation of a second gate material, according to embodiments of the present disclosure.

A second gate material 140 may then be formed within the trenches 112, as shown in FIG. 8, to form a set of gates 145 in the device 100. In some embodiments, a gate oxide layer 142 may be formed along the exposed sidewalls 124 of the trenches 112 prior to deposition of the second gate material 140. As shown, the gate oxide layer 142 generally connects with the spacer layer 120 and the gate isolation layer 134 to fully separate the first gate material 128 from the second gate material 140. In some embodiments, the second gate material 140 may be active n-type polysilicon deposited over the gate isolation layer 134. In some embodiments, the first gate material 128 of one or more of the gates 145 is grounded, i.e., connected to the source layer 108, while the second gate material 140 is an operational or active gate in which voltage varies from ground to $V_{dd}$. The first gate material 140 is considered shielded because it blocks gate-to-drain charges from the active second gate material 140.

In sum, embodiments herein disclose a device and associated process flow for forming the device in which a split-gate MOSFET is formed with a buried gate shielding layer. By doping trench bottoms prior to gate material deposition, gate capacitance can be minimized, which improves overall MOSFET device scaling.

Figure 9:
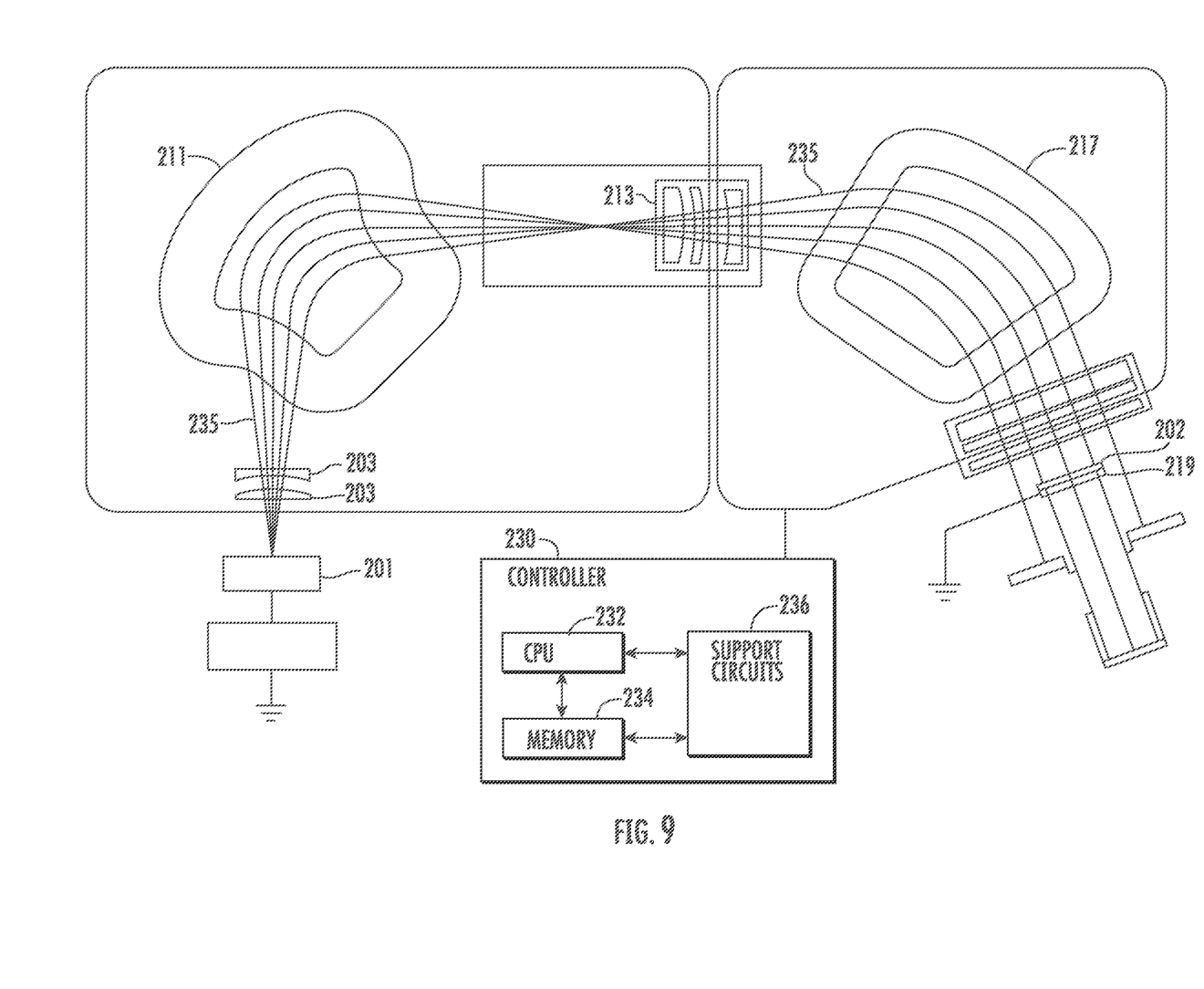
FIG. 9 illustrates a schematic diagram of a processing apparatus according to embodiments of the present disclosure.

FIG. 9 illustrates a schematic diagram of a processing apparatus 200 useful to perform processes described herein. One example of a beam-line ion implantation processing apparatus is the Varian VIISTA® Trident, available from Applied Materials Inc., Santa Clara, Calif. The processing apparatus 200 may include an ion source 201 for generating ions. For example, the ion source 201 may provide an ion implant, such as the ion implant 114 demonstrated in FIG. 2 for forming the gate shielding layers 118 in the device 100. The processing apparatus 200 may also include a series of beam-line components. Examples of beam-line components may include extraction electrodes 203, a magnetic mass analyzer 211, a plurality of lenses 213, and a beam parallelizer 217. The processing apparatus 200 may also include a platen 219 for supporting a substrate 202 to be processed. The substrate 202 may be the same as the substrate 102 described above from which the device 100 is formed. The substrate 202 may be moved in one or more dimensions (e.g. translate, rotate, tilt, etc.) by a component sometimes referred to as a "roplat" (not shown). It is also contemplated that the processing apparatus 200 may be configured to perform heated implantation processes to provide for improved control of implantation characteristics, such as the ion trajectory and implantation energy utilized to dope the substrate.

In operation, ions of the desired species, for example, dopant ions, are generated and extracted from the ion source 201. Thereafter, the extracted ions 235 travel in a beam-like state along the beam-line components and may be implanted in the substrate 202. Similar to a series of optical lenses that manipulate a light beam, the beam-line components manipulate the extracted ions 235 along the ion beam. In such a manner, the extracted ions 235 are manipulated by the beam-line components while the extracted ions 235 are directed toward the substrate 202. It is contemplated that the apparatus 200 may provide for improved mass selection to implant desired ions while reducing the probability of undesirable ions (impurities) being implanted in the substrate 202.

In some embodiments, the processing apparatus 200 can be controlled by a processor-based system controller such a controller 230. For example, the controller 230 may be configured to control beam-line components and processing parameters associated with beam-line ion implantation processes. The controller 230 may include a programmable central processing unit (CPU) 232 that is operable with a memory 234 and a mass storage device, an input control unit, and a display unit (not shown), such as power supplies, clocks, cache, input/output (I/O) circuits, and the like, coupled to the various components of the processing apparatus 200 to facilitate control of the substrate processing. The controller 230 also includes hardware for monitoring substrate processing through sensors in the processing apparatus 200, including sensors monitoring the substrate position and sensors configured to receive feedback from and control a heating apparatus coupled to the processing apparatus 200. Other sensors that measure system parameters such as substrate temperature and the like, may also provide information to the controller 230.

To facilitate control of the processing apparatus 200 described above, the CPU 232 may be one of any form of general-purpose computer processor that can be used in an industrial setting, such as a programmable logic controller (PLC), for controlling various chambers and sub-processors. The memory 234 is coupled to the CPU 232 and the memory 234 is non-transitory and may be one or more of readily available memory such as random access memory (RAM), read only memory (ROM), floppy disk drive, hard disk, or any other form of digital storage, local or remote. Support circuits 236 may be coupled to the CPU 232 for supporting the processor in a conventional manner. Implantation and other processes are generally stored in the memory 234, typically as a software routine. The software routine may also be stored and/or executed by a second CPU (not shown) that is remotely located from the hardware being controlled by the CPU 232.

The memory 234 is in the form of computer-readable storage media that contains instructions, that when executed by the CPU 232, facilitates the operation of the apparatus 200. The instructions in the memory 234 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

It is to be understood that the various layers, structures, and regions shown in the accompanying drawings are schematic illustrations. For ease of explanation, one or more layers, structures, and regions of a type commonly used to form semiconductor devices or structures may not be explicitly shown in a given drawing. This does not imply that any layers, structures, and/or regions not explicitly shown are omitted from the actual semiconductor structures.

In various embodiments, design tools can be provided and configured to create the datasets used to pattern the semiconductor layers of the apparatus 200, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading the Detailed Description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporating the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
   providing a device structure including a well formed in an epitaxial layer, and a source layer formed atop the well;
   forming a set of trenches through the well and the epitaxial layer;
   implanting the device structure to form a gate shield layer at a bottom of each of the set of trenches; and
   forming a gate spacer layer over the device structure including directly atop the source layer and within the set of trenches, wherein the gate spacer layer is further formed directly atop a body contact in the well.

2. The method of claim 1, wherein the set of trenches is further formed through the source layer.

3. The method of claim 2, further comprising etching the device structure to remove the gate spacer layer selective to a top surface of the source layer and from an upper surface of the gate shield layer within the set of trenches.

4. The method of claim 3, further comprising forming a first gate material within the set of trenches.

5. The method of claim 4, wherein forming the first gate material comprises:
   depositing a doped p-type polysilicon within the set of trenches; and
   planarizing the doped p-type polysilicon selective to the top surface of the source layer.

6. The method of claim 4, further comprising:
   partially recessing the first gate material and the gate spacer layer within the set of trenches;
   forming a gate isolation layer over the first gate material; and
   forming a second gate material over the gate isolation layer.

7. The method of claim 6, further comprising:
   forming a gate oxide layer along each sidewall of the set of trenches; and
   forming the second gate material within the set of trenches after the gate oxide layer is formed along each sidewall of the set of trenches.

8. The method of claim 6, wherein forming the second gate material comprises depositing an active n-type polysilicon within the set of trenches.

9. The method of claim 6, wherein forming the gate isolation layer comprises oxidizing the first gate material, wherein the gate isolation layer extends to the gate spacer layer.

10. The method of claim 1, further comprising a second body contact in the well, wherein the well is a p-type well and the body contact and the second body contact are each p-type body contacts.

11. A method of forming a MOSFET device, comprising:
    providing a device structure including an epitaxial layer atop a substrate, wherein a well is formed in the epitaxial layer;
    providing a source layer atop the well;
    forming a set of trenches through the source layer, the well, and the epitaxial layer;
    implanting the device structure to form a gate shield layer at a bottom of each of the set of trenches;
    forming a gate spacer layer directly atop the source layer and the gate shield layer wherein the gate spacer layer is further formed directly atop a body contact in the well;
    forming a first gate material and a second gate material over the gate shield layer at the bottom of each of the set of trenches, wherein the first gate material and the second gate material are separated by a gate isolation layer.

12. The method of claim 11, further comprising removing the gate spacer layer from an upper surface of the gate shield layer within the set of trenches.

13. The method of claim 12, further comprising:
    partially recessing the first gate material and the gate spacer layer within the set of trenches;
    forming the gate isolation layer at a top of the recessed first gate material; and
    forming the second gate material over the gate isolation layer.

14. The method of claim 13, further comprising forming a gate oxide layer along each sidewall of the set of trenches after the first gate material and the gate spacer layer are recessed within the set of trenches, wherein the second gate material is deposited within the set of trenches following formation of the gate oxide layer, and wherein forming the gate isolation layer comprises oxidizing the first gate material.

15. The method of claim 11, wherein forming the first gate material comprises depositing a p-type polysilicon within the set of trenches, and wherein forming the second gate material comprises depositing an active n-type polysilicon within the set of trenches.

16. The method of claim 11, further comprising providing a second body contact in the well, wherein the well is a p-type well and the body contact and the second body contact are each p-type body contacts.

* * * * *